United States Patent
Keehn et al.

(10) Patent No.: US 12,484,193 B2
(45) Date of Patent: Nov. 25, 2025

(54) SYSTEMS AND METHODS FOR THERMAL MANAGEMENT OF ELECTRONIC DEVICES

(71) Applicant: Microsoft Technology Licensing, LLC, Redmond, WA (US)

(72) Inventors: Nicholas Andrew Keehn, Kirkland, WA (US); Husam Atallah Alissa, Redmond, WA (US); Bharath Ramakrishnan, Bellevue, WA (US); Vaidehi Oruganti, Kirkland, WA (US); Ioannis Manousakis, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 263 days.

(21) Appl. No.: 18/120,861

(22) Filed: Mar. 13, 2023

(65) Prior Publication Data
US 2024/0314977 A1 Sep. 19, 2024

(51) Int. Cl.
*F28F 7/00* (2006.01)
*H05K 7/20* (2006.01)

(52) U.S. Cl.
CPC ..... *H05K 7/20327* (2013.01); *H05K 7/20381* (2013.01)

(58) Field of Classification Search
CPC .............. H05K 7/20327; H05K 7/20381
USPC ...................................... 165/80.3
See application file for complete search history.

(56) References Cited

U.S. PATENT DOCUMENTS

| | | |
|---|---|---|
| 2005/0178529 A1 | 8/2005 | Suzuki |
| 2006/0060331 A1 | 3/2006 | Glezer et al. |
| 2008/0043438 A1* | 2/2008 | Refai-Ahmed ..... F28D 15/0266 257/E23.088 |
| 2014/0218861 A1 | 8/2014 | Shelnutt et al. |
| 2019/0373771 A1* | 12/2019 | Yen ........................ H01L 23/427 |
| 2020/0355442 A1 | 11/2020 | Lewis et al. |
| 2022/0015266 A1 | 1/2022 | Narain et al. |
| 2022/0110220 A1 | 4/2022 | Yalamarthy |
| 2022/0187033 A1 | 6/2022 | Sankar |

FOREIGN PATENT DOCUMENTS

GB 2547432 A * 8/2017

OTHER PUBLICATIONS

International Search Report and Written Opinion received for PCT Application No. PCT/US2024/018579, Jun. 11, 2024, 13 pages.

* cited by examiner

*Primary Examiner* — Davis D Hwu
(74) *Attorney, Agent, or Firm* — Ray Quinney & Nebeker P.C.; Paul N. Taylor

(57) ABSTRACT

A thermal management device includes a body, a fluid movement structure, and a movement mechanism. The body is configured to receive heat from a heat-generating component at a proximal surface, and the fluid movement structure is on a distal surface of the body that is distal to the proximal surface, wherein the fluid movement structure is configured to direct fluid flow of a working fluid and the body is configured to transfer heat to the working fluid. The movement mechanism is configured to move the fluid movement structure relative to the body.

17 Claims, 9 Drawing Sheets

SYSTEMS AND METHODS FOR THERMAL MANAGEMENT OF ELECTRONIC DEVICES

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some embodiments, a thermal management device includes a body, a fluid movement structure, and a movement mechanism. The body is configured to receive heat from a heat-generating component at a proximal surface, and the fluid movement structure is on a distal surface of the body that is distal to the proximal surface, wherein the fluid movement structure is configured to direct fluid flow of a working fluid and the body is configured to transfer heat to the working fluid. The movement mechanism is configured to move the fluid movement structure relative to the body.

In some embodiments, a thermal management device includes a body, a fluid movement structure, and a means for moving the fluid movement structure. The body is configured to receive heat from a heat-generating component. The fluid movement structure is positioned on a surface of the body, and the means for moving the fluid movement structure moves the fluid movement structure relative to the surface of the body.

In some embodiments, a method of thermal management includes transferring heat from a heat-generating component to a working fluid with a thermal management device thermally coupled to the heat-generating component, positioning a fluid movement structure of the thermal management device in the working fluid, moving the fluid movement structure in the working fluid in a first direction, directing flow of the working fluid based at least partially on the movement of the fluid movement structure in the working fluid, and restoring the fluid movement structure to an original position.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 through 3-4 are a side view of a thermal management device with fluid movement structures, according to at least one embodiment of the present disclosure;

FIG. 4 is a side view of a thermal management device with internal fluid movement structures, according to at least one embodiment of the present disclosure;

FIGS. 8-1 and 8-2 illustrate a thermal management device with an array of fluid movement structures configure to create channels therethrough, according to at least one embodiment of the present disclosure;

FIG. 9-1 through 9-3 illustrate a thermal management device with a grid fluid movement structure, according to at least one embodiment of the present disclosure;

DETAILED DESCRIPTION

Figure 1:
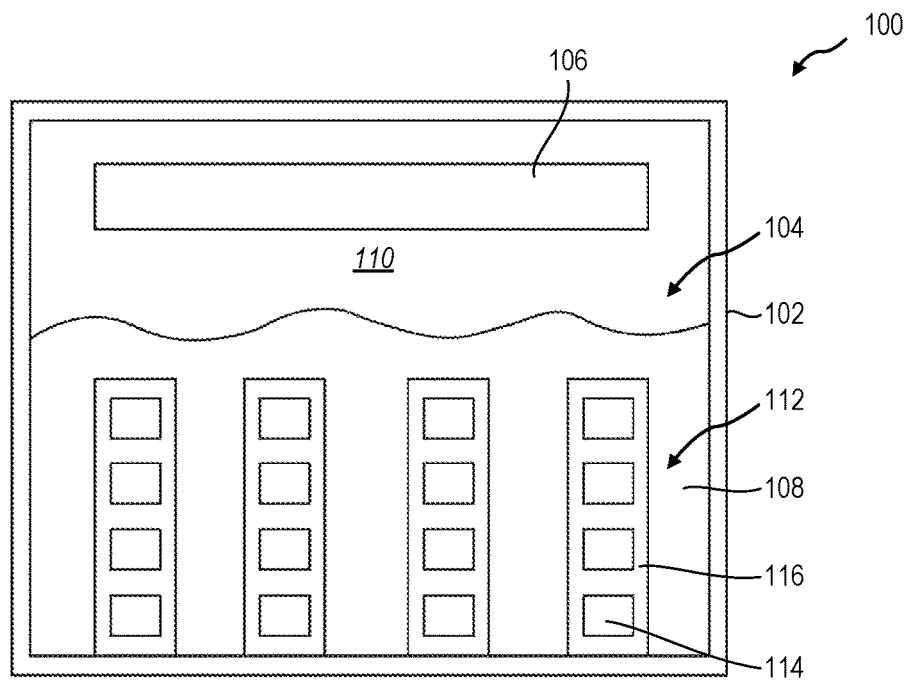
FIG. 1 is a side schematic representation of an immersion cooling system, according to at least one embodiment of the present disclosure.

The present disclosure relates generally to systems and methods for thermal management of electronic devices or other heat-generating components. A thermal management device immersed in the working fluid transfers heat from the heat-generating components to the working fluid. The thermal transfer rate to the working fluid is based partially on a temperature difference between the thermal management device coupled to the heat-generating component and the working fluid. For example, a larger temperature difference creates a higher thermal transfer rate. The thermal transfer rate to the working fluid is based partially on the phase of the working fluid. For example, the thermal transfer rate to the liquid phase of the working fluid is higher than the thermal transfer rate to the vapor phase of the working fluid.

In some embodiments, a thermal management device, according to the present disclosure, includes at least one movable fluid movement structure positioned on a surface of a body of the thermal management device. A movement mechanism or means for moving the fluid movement structure is configured to move the fluid movement structure relative to the surface of the body of the thermal management device and/or relative to other fluid movement structures of the thermal management device.

In some embodiments, the movement mechanism is or includes a piezoelectric element, a shape memory element, a thermal expansion element, a magnetic element, a chemically reactive element, or combinations thereof. The movement mechanism is, in some embodiments, affixed to the fluid movement structure. For example, the fluid movement structure may be an elongated metal rod, and a piezoelectric element affixed to a lateral side of the elongated metal rod is configured to elastically deform the elongated metal rod in the lateral direction when an electric potential is applied thereto. In other embodiments, the movement mechanism is integrally formed with the fluid movement structure. For example, the fluid movement structure may be formed of a shape memory material which, when heated beyond a transition temperature, changes macro shape based on microstructural transitions.

The fluid movement structures of the thermal management device, in some embodiments, direct or urge working fluid relative to a surface of the body of the thermal management device to increase a thermal transfer rate between the thermal management device and the working fluid. In some embodiments, one or more fluid movement structures are movable relative to a surface of the body of the thermal management device using the movement mechanism to dislodge vapor bubbles from the surface of the body of the fluid movement structure(s) and/or thermal management device. In some embodiments, one or more fluid movement structures are movable relative to a surface of the body of the thermal management device using the movement mechanism to pump or urge the working fluid across the surface of the body of the thermal management device. The one or more fluid movement structures, thereby, expel hot working fluid and provide a supply of cooler working fluid to the thermal management device. In some embodiments, one or more fluid movement structures are movable relative to a surface of the body of the thermal management device using the movement mechanism to alter a topography of the thermal management device (e.g., create channels or passages) and direct working fluid toward higher temperature regions of the thermal management device, thereby increasing thermal efficiency of the thermal management device. For example, the heat-generating component may produce heat heterogeneously, and thermal management requirements of the thermal management device may change depending on the operational conditions of the heat-generating component.

In some embodiments, the one or more fluid movement structures are actively actuated. Active actuation allows the one or more fluid movement structures of the thermal management device to selectively move or otherwise respond based at least partially on conditions of the working fluid and/or heat-generating component. For example, a controller may be in communication with one or more sensors (temperature sensors, flow rate sensors, vapor sensors, etc.) and the controller may actuate the one or more fluid movement structures in response to measurements of the sensor(s). In some embodiments, the one or more fluid movement structures are passively actuated. Passive actuation may allow the one or more fluid movement structures to move or otherwise respond based at least partially on conditions of the working fluid and/or heat-generating component without external controls, sensors, or wires. For example, a fluid movement structure including or made of a shape memory material with a transition temperature at or above the boiling temperature of the working fluid will remain in a first state while immersed in the liquid phase of the working fluid. In such an example, when the fluid movement structure contacts a vapor phase of the working fluid, the vapor phase allows the fluid movement structure to rise in temperature, allowing the shape memory material to transition to a second state, resulting in a passive actuation of the fluid movement structure. The fluid movement structure is therefore in a first position (first microstructural state) when in contact with liquid phase working fluid and transitions to a second position (second microstructural state) when in contact with vapor phase working fluid.

In some embodiments, the movement mechanism includes a piezoelectric fluid movement structure. In some embodiments, a piezoelectric fluid movement structure is a fluid movement structure with a piezoelectric material coupled thereto and configured to apply a force to the fluid movement structure. In some embodiments, a piezoelectric fluid movement structure is a fluid movement structure made of or including a piezoelectric material integrally formed therewith. The fluid movement structure is configured to change shape in at least one dimension when an electric potential is applied to the piezoelectric material.

In some embodiments, the movement mechanism includes a shape memory fluid movement structure. In some embodiments, a shape memory fluid movement structure is a fluid movement structure with a shape memory material (shape memory alloy, shape memory polymer, etc.) coupled thereto and configured to apply a force to the fluid movement structure. In some embodiments, a shape memory fluid movement structure is a fluid movement structure made of or including a shape memory material integrally formed therewith. The fluid movement structure is configured to change shape in at least one dimension upon heating or cooling beyond a transition temperature.

In some embodiments, the movement mechanism includes a magnetic fluid movement structure. In some embodiments, a magnetic fluid movement structure is a fluid movement structure with a ferromagnetic material coupled thereto and configured to apply a force to the fluid movement structure. In some embodiments, a magnetic fluid movement structure is a fluid movement structure made of or including a ferromagnetic material integrally formed therewith. The fluid movement structure is configured to change shape in at least one dimension upon exposure to a magnetic field. In some embodiments, a magnetic fluid movement structure is a fluid movement structure with an electromagnet coupled thereto and configured to apply a force to the fluid movement structure. The electromagnetic generates a magnetic field and the fluid movement structure experiences an associated force based on the interaction of the magnetic field of the electromagnetic with another ferromagnetic material, such as a second fluid movement structure or an external ferromagnetic material positioned proximate the thermal management device.

In some embodiments, the movement mechanism includes a thermal expansion fluid movement structure. In some embodiments, a thermal expansion fluid movement structure is a fluid movement structure with a including a first material and a second material wherein the first material has a first coefficient of thermal expansion that is different from that of the second material. For example, the first material may be coupled to the second material of the fluid movement structure. Upon changes in temperature, the difference in thermal expansion between the first material and second material applies a force to move the fluid movement structure in at least one dimension. In some embodiments, a thermal expansion fluid movement structure is a fluid movement structure made of or including a combination of materials integrally formed such that, upon changes in temperature, the difference in thermal expansion between the first material and second material applies a force to move the fluid movement structure in at least one dimension. The fluid movement structure is configured to change shape in at least one dimension upon heating or cooling temperature.

In some embodiments, the movement mechanism includes a chemically reactive fluid movement structure. In some embodiments, a chemically reactive fluid movement structure is a fluid movement structure with a chemically reactive material coupled thereto and configured to apply a force to the fluid movement structure. In some embodiments, a chemically reactive fluid movement structure is a fluid movement structure made of or including a chemically reactive material integrally formed therewith. The chemically reactive fluid movement structure is configured to change shape in at least one dimension when the chemically reactive material is exposed to an activation chemical. In some embodiments, the activation chemical is introduced to the working fluid in which the chemically reactive fluid movement structure is immersed. In some embodiments, the thermal management device includes an internal volume into which the activation chemical is introduced to activate the chemically reactive fluid movement structure and move the chemically reactive fluid movement structure in the working fluid.

In at least one embodiment, the fluid movement structure includes a combination of movement mechanisms described herein. In at least one example, a fluid movement structure is movable in a first direction by a first movement mechanism and movable in a second direction by a second movement mechanism. In some embodiments, the first direction and second direction are opposite one another. In some embodiments, the first direction and second direction are orthogonal to one another. In some embodiments, the first direction and second direction are at a non-orthogonal angle to one another.

The fluid movement structures of the thermal management devices described herein have a variety of shapes or sizes. In some embodiments, the fluid movement structures are or include a pin, rod, leaf, fin, grid, mesh, pipe, cylinder, wire, or combinations thereof.

In some embodiments, at least some of the fluid movement structures are located on an external surface of the body of the thermal management device. For example, the thermal management device is coupled to a heat-generating component and the fluid movement structure(s) is located on an outside surface of the body opposite the heat-generating component. In such embodiments, the external fluid movement structures contact a working fluid that receives heat from the thermal management device and carries the heat away from the thermal management device to cool the heat-generating component. In some embodiments, the external fluid movement structures direct the movement of the working fluid relative the thermal management device, such as directing the flow toward hotter regions of the thermal management device. In some embodiments, the external fluid movement structures limit and/or prevent dryout of the thermal management device by ejecting vapor bubbles from the external fluid movement structures and/or a surface of the body of the thermal management device.

In some embodiments, at least some of the fluid movement structures are located on an internal surface of the body of the thermal management device, such as contacting a working fluid contained in a vapor chamber or other internal volume of the thermal management device. In such embodiments, the internal fluid movement structures contact a working fluid that receives heat from the thermal management device and carries the heat away from the thermal management device to cool the heat-generating component. In some embodiments, the internal fluid movement structures direct the movement of the working fluid through the internal volume of the thermal management device, such as directing the flow of hot working fluid to cooler regions of the thermal management device. In some embodiments, the internal fluid movement structures promote movement of the working fluid through the internal volume of the thermal management device by ejecting vapor bubbles from the internal fluid movement structures and/or the internal surface of the body of the thermal management device.

In some embodiments, the movement mechanism includes an activation device that activates and/or moves the fluid movement structures. The activation device is external to the fluid movement structures of the thermal management device and applies or provides a signal, energy, field, reagent, or other activation mechanism to the fluid movement structure to move the fluid movement structure. In some embodiments, the activation device includes an electrical source configured to apply an electric potential (e.g., to the fluid movement structure). For example, the electrical potential may be delivered through a conductive element to a piezoelectric fluid movement structure to activate the piezoelectric element. In some examples, the electrical potential is delivered via an electric field to a piezoelectric fluid movement structure to activate the piezoelectric element.

In some embodiments, the activation device includes a magnetic field source that applies a magnetic field to the fluid movement structure to move the fluid movement structure. For example, an electromagnetic activation device may apply a magnetic field in a variety of directions to apply an associated magnetic force to the fluid movement structure to move the fluid movement structure in a selected direction.

In some embodiments, an activation device includes a chemical activation device that selectively provides a chemical agent to the fluid movement structure to activate and move the fluid movement structure. In at least one example, the chemical activation device introduces the chemical agent to the working fluid in which the thermal management device is immersed. In at least another example, the chemical activation device introduces the chemical agent to an internal volume of the thermal management device, and the chemical agent contacts a portion of the fluid movement structure proximate the internal volume.

Thermal management devices, according to the present disclosure, may be used in an immersion cooling system to increase the efficiency of the immersion cooling system. Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
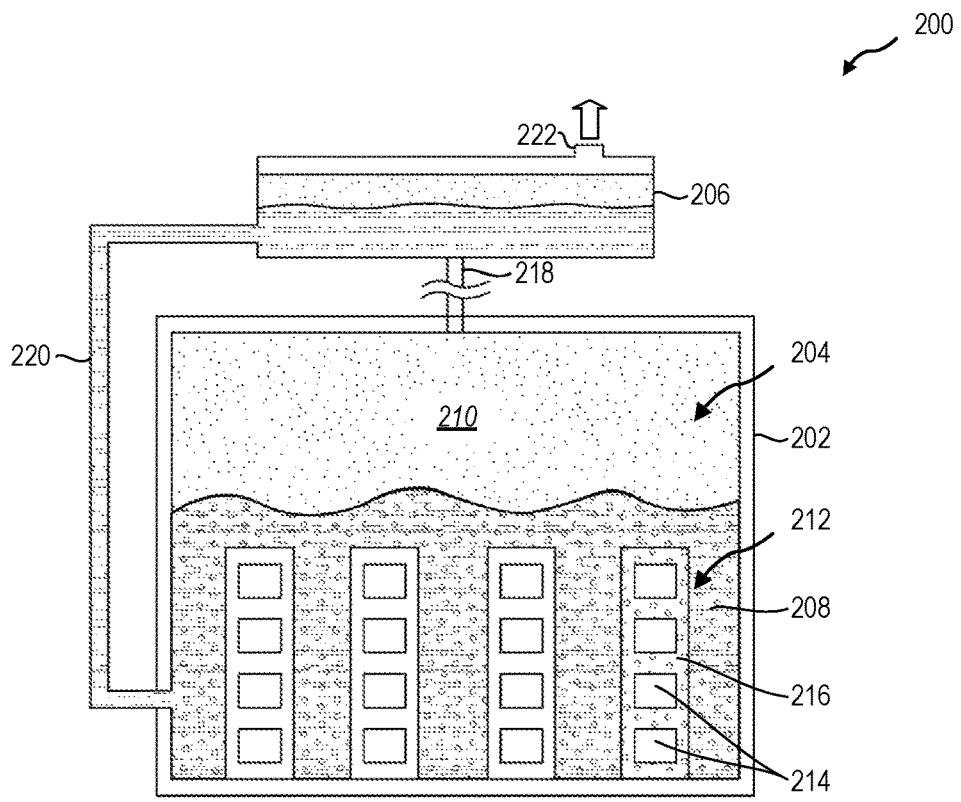
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a thermal management device or other device attached to the heat-generating component 214 to conduct away thermal energy and effectively increase the surface area of the heat-generating component 214. In some embodiments, the thermal management device of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Figures 1, 3:
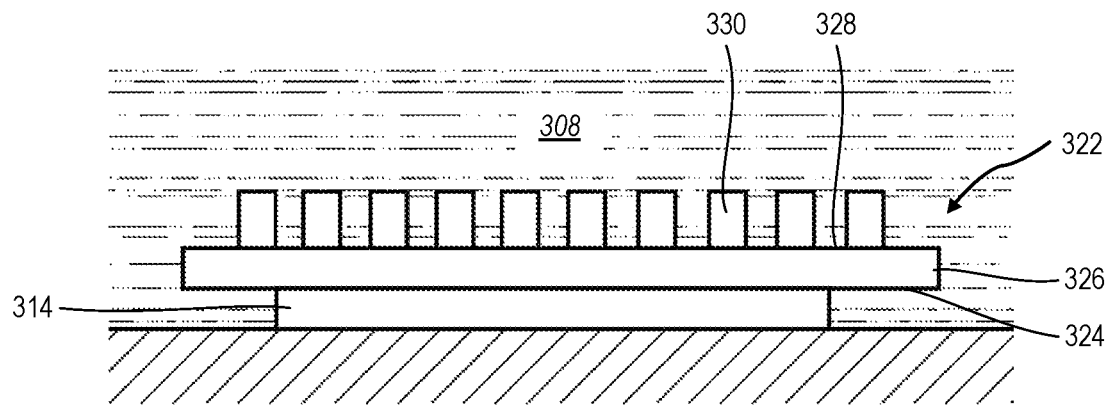
Figures 2, 3:
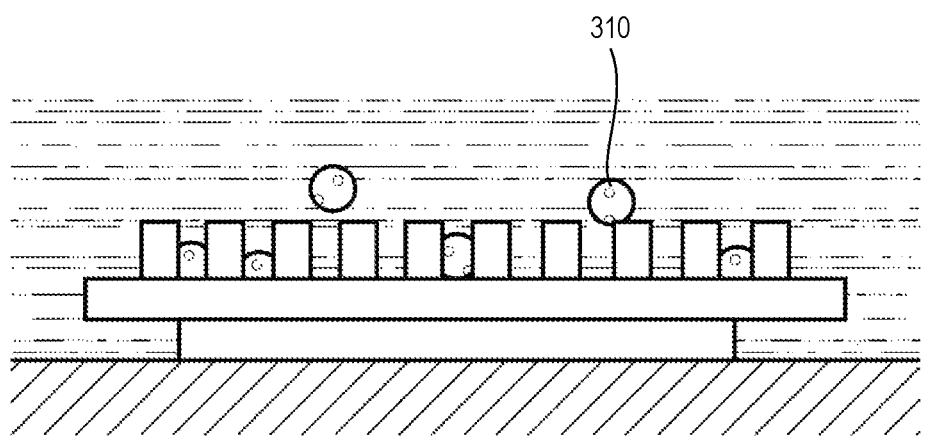
Figure 3:
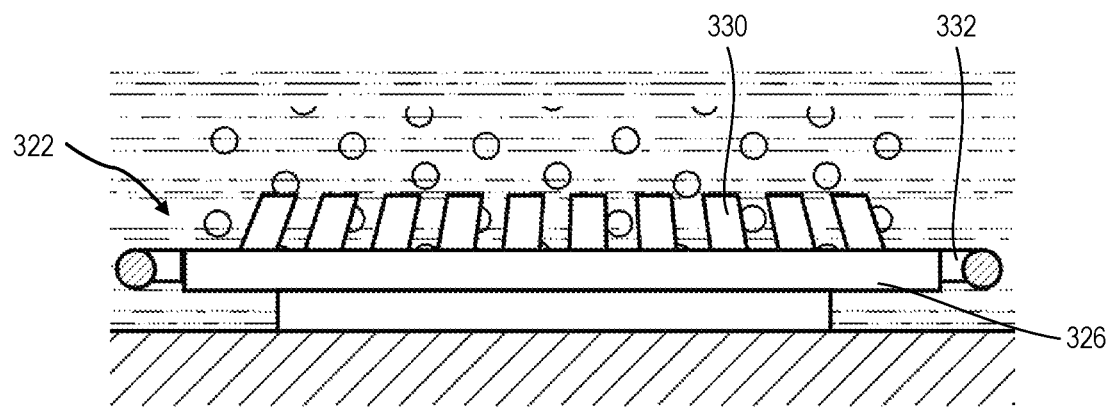

FIG. 3 is a side view of an embodiment of a thermal management device 322 thermally coupled, at a proximal surface 324 of a body 326 of the thermal management device 322, to a heat-generating component 314. In some embodiments, the thermal management device is directly coupled to the heat-generating component. For example, the thermal management device may be directly contacting the heat-generating component on a proximal surface of the body. In some embodiments, the thermal management device is indirectly thermally coupled to the heat-generating component. For example, the thermal management device may be thermally coupled to the heat-generating electronic component by a thermal interface material, such as thermal paste, positioned between a proximal surface of the body of the thermal management device and the heat-generating electronic component. In some examples, the thermal management device may be thermally coupled to the heat-generating electronic component by a liquid phase metal positioned between a proximal surface of the body of the thermal management device and the heat-generating electronic component. In some examples, the thermal management device may be thermally coupled to the heat-generating electronic component by a heat spreader positioned between a proximal surface of the body of the thermal management device and the heat-generating electronic component. In some embodiments, the thermal management device is thermally coupled to the heat-generating electronic component by a heat sink positioned between and contacting a proximal surface of the body of the thermal management device and the heat-generating electronic component. In some embodiments, the thermal management device is thermally coupled to the heat-generating electronic component by a heat pipe positioned between and contacting a proximal surface of the body of the thermal management device and the heat-generating electronic component. In some embodiments, the thermal management device is thermally coupled to the heat-generating electronic component by a vapor chamber positioned between and contacting a proximal surface of the body of the thermal management device and the heat-generating electronic component.

A plurality of fluid movement structures 330 is positioned on an outer surface (e.g., a distal surface 328) of the body 326 of the thermal management device opposite the heat-generating component 314. In some embodiments, the fluid movement structures are immersed in a working fluid. As the heat-generating component produces heat during operation, the heat is transferred to the thermal management device and from the thermal management device to the working fluid. In the embodiment illustrated in FIG. 3-1, the working fluid is a two-phase working fluid, and the liquid phase 308 vaporizes into vapor bubbles of the working fluid upon receiving a sufficient quantity of heat from the thermal management device 322. Referring now to FIG. 3-2, the vapor bubbles of a vapor phase 310, in some embodiments, adhere to the outer surface of the body 326 of the thermal management device 322 and/or to the fluid movement structures 330 of the thermal management device 322. The vapor bubbles contacting the thermal management device 322 reduce the thermal transfer rate from the thermal management device 322 to the working fluid. A reduction in thermal transfer rate from the thermal management device 322 to the working fluid, in some embodiments, reduces a thermal transfer rate from the heat-generating component 314 to the thermal management device 322 and adversely affects the heat-generating component 314.

FIG. 3-3 is a side view of the embodiment of a thermal management device 322 of FIG. 3-2 after activation of the movement mechanism of the thermal management device 322 to move the plurality of fluid movement structures 330. The movement mechanism, in the illustrated embodiment, moves the fluid movement structures 330 in a convergent lateral direction relative to a longitudinal direction of the fluid movement structures to dislodge, shake, or otherwise eject the vapor bubbles from the outer surface of the body 326 and fluid movement structures 330 of the thermal management device 322. The convergent lateral direction is a lateral direction of each fluid movement structure 330 that is toward a center of the thermal management device 322. For example, a magnetic activation device 332 including a loop of conductive material positioned around the body 326 of the thermal management device 322 may generate a convergent magnetic field to urge magnetic fluid movement structures 330 in a convergent lateral direction. The direction of a current in the loop of conductive material may be changed to reverse the direction of the magnetic field and urge the fluid movement structures in a different direction to dislodge, shake, or otherwise eject the vapor bubbles from the outer surface of the body and fluid movement structures of the thermal management device.

Figures 3, 4:
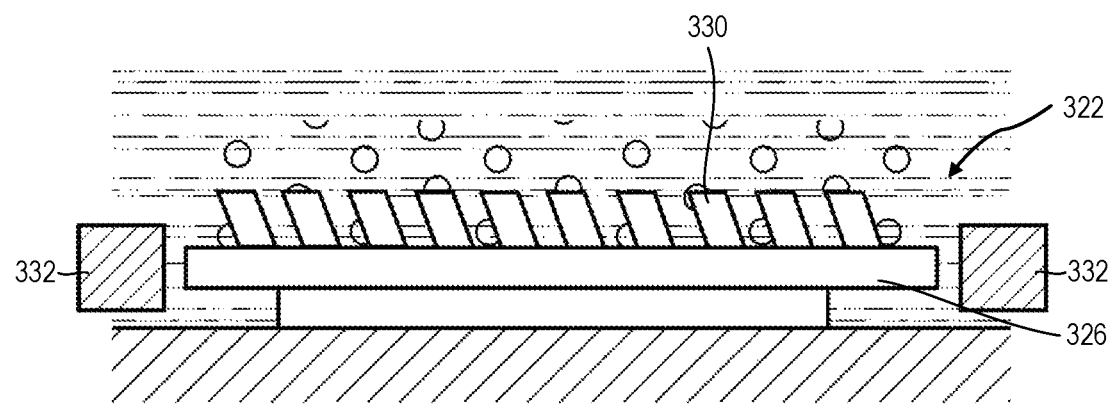
Figure 4:
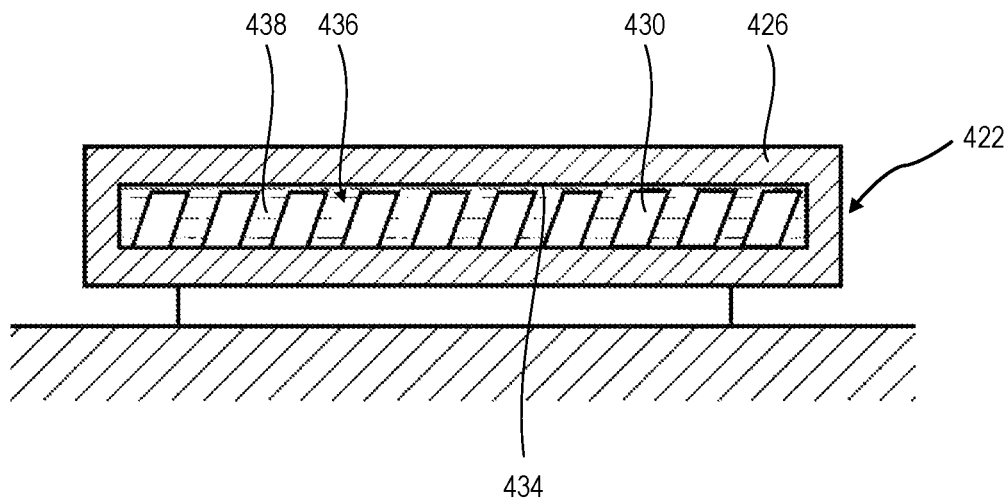

In some embodiments, the movement mechanism moves each of the fluid movement structures in the same lateral direction, such as illustrated in FIG. 3-4. For example, a magnetic activation device 332 with a first electromagnet on a first lateral side of the thermal management device 322 and a second electromagnet on a second lateral side of the thermal management device 322 opposite the first side may generate a substantially linear magnetic field that urges the fluid movement structures 330 in a substantially uniform lateral direction to dislodge, shake, or otherwise eject the vapor bubbles from the outer surface of the body 326 and fluid movement structures 330 of the thermal management device 322.

In some embodiments, activation device or movement mechanism of the thermal management device is configured to move different fluid movement structures at different times relative to one another. For example, a first electromagnet may apply a first magnetic field to a first portion of the array of fluid movement structures, and a second electromagnet may apply a second magnetic field to a second portion of the array of fluid movement structures at a different time. In other examples, a chemical agent activates fluid movement structures in sequence as the chemical agent flows across a surface of the thermal management device, and the fluid movement structures activate at different times in response to the movement of the chemical agent. In some embodiments, the movement mechanism moves the fluid movement structures in a wave-like pattern to urge the working fluid in the direction of the wave.

FIG. 4 is a side cross-sectional view of an embodiment of a thermal management device 422 with fluid movement structures 430 located on an internal surface 434 of the body 426 of the thermal management device 422. In some embodiments, the body 426 is a fluid heat spreader configured to spread heat via a working fluid 438 in the body 426. The thermal management device 422 includes an internal volume 436 containing a working fluid 438 that flows within the internal volume 436 to distribute heat through the thermal management device 422. In some embodiments, the fluid movement structures 430 are configured to move relative to the internal surface 434 of the body 426 to move the working fluid 438 in the internal volume 436. For example, at least some of the fluid movement structures 430 are configured to move in a lateral direction relative to a normal direction of the internal surface 434 of the body 426 from which the fluid movement structures 430 protrude. In some embodiments, the lateral movement of the fluid movement structures 430 sweeps or pumps working fluid 438 within the internal volume 436 based on active or passive activation to move heat in the thermal management device 422. In some embodiments, a thermal management device includes internal fluid movement structures 430 such as described in relation to FIG. 4 and external fluid movement structures 330 such as described in relation to FIG. 3-1 through 3-4.

Figure 5:
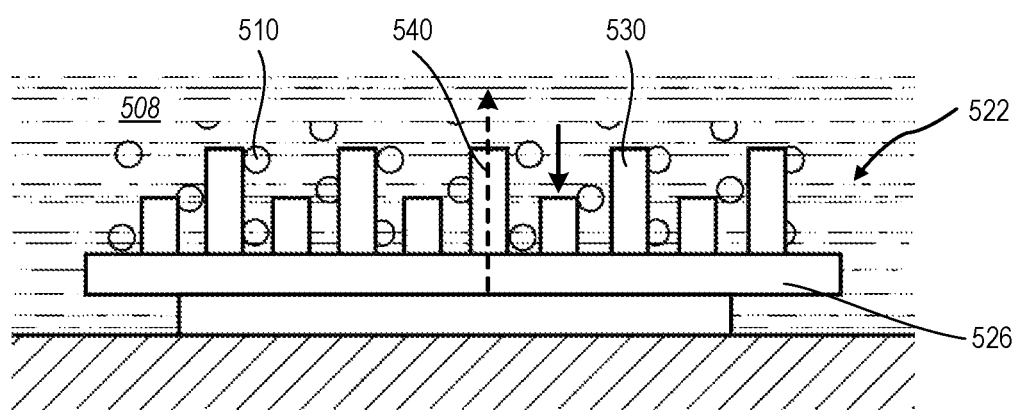
FIG. 5 is a side view of a thermal management with fluid movement structures configured to change longitudinal length. according to at least one embodiment of the present disclosure.

In some embodiments, at least one fluid movement structure of a thermal management device is configured to move or change dimension in longitudinal direction of the fluid movement structure. FIG. 5 illustrates an embodiment of a thermal management device 522 with a plurality of external fluid movement structures 530. The fluid movement structures 530, in some embodiments, are configured to change dimension in a longitudinal direction 540. Extending or shortening in longitudinal length can allow the fluid movement structures 530 to change a surface area to volume ratio of the fluid movement structure 530, allow the fluid movement structure 530 to extend into or retract from the flow of liquid working fluid 508, eject vapor bubbles of the vapor working fluid 510 from the fluid movement structure 530 and/or outer surface of the body 526 of the thermal management device 522, or combinations thereof. The thermal efficiency and/or thermal transfer rate between the thermal management device 522 and the working fluid in which the thermal management device 522 is immersed is therefor altered by changes of the fluid movement structures 530 in the longitudinal direction 540.

Figure 6:
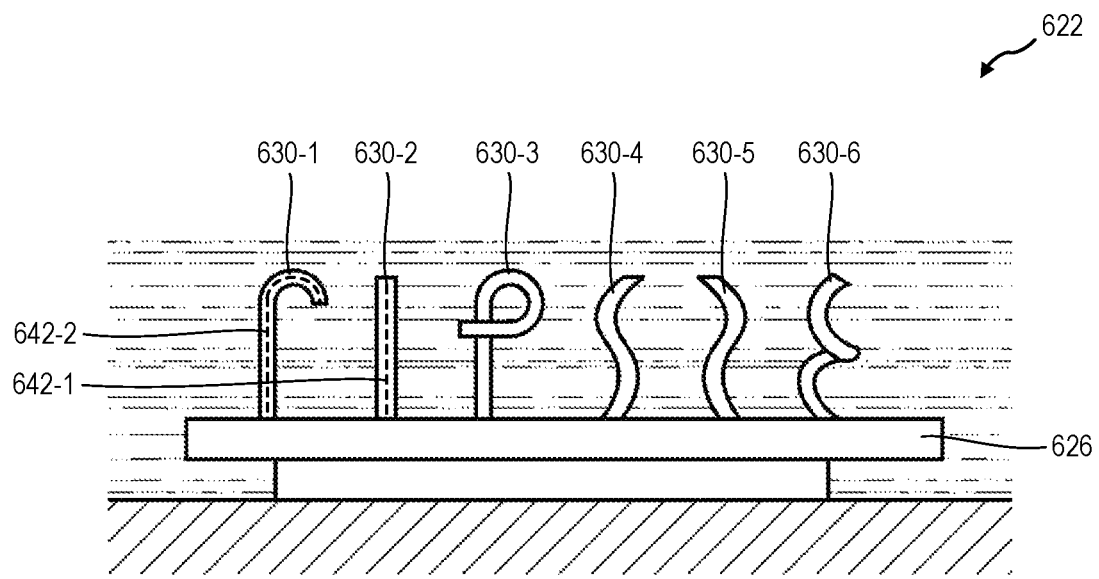
FIG. 6 is a side view of a thermal management with fluid movement structures configured to change shape. according to at least one embodiment of the present disclosure.

While examples of fluid movement structures have been described herein that move or change dimension in a lateral direction and/or a longitudinal direction, it should be understood that fluid movement structures may change between any positions, dimensions, or shapes to change thermal properties and/or eject vapor bubbles according to the present disclosure. In some embodiments, a fluid movement structure curves, twists, loops, or otherwise changes a direction of a longitudinal axis of the fluid movement structure. FIG. 6 is a side view of an embodiment of a thermal management device 622 including a plurality of fluid movement structures 630 positioned on a surface of a body 626 thereof. In some embodiments, at least one fluid movement structure 630 has a first state with a first longitudinal axis 642-1 and a second state with a different shape or orientation longitudinal axis 642-2 wherein the fluid movement structure changes from the first state to the second state when activated by a movement mechanism. In at least one example, fluid movement structures include shape memory materials that, when activated, cause the longitudinal axis of the fluid movement structure to curve, twist, loop, or otherwise change direction.

In some embodiments, a first state has a substantially straight longitudinal axis 642-1, such as the second fluid movement structure 630-2 illustrated in FIG. 6. In some embodiments, a second state has a curved longitudinal axis 642-2, such as the first fluid movement structure 630-1 illustrated in FIG. 6. In some embodiments, a second state has a looped longitudinal axis (e.g., curved to overlap another portion of the fluid movement structure), such as the third fluid movement structure 630-3 illustrated in FIG. 6. In some embodiments, a second state has a curved longitudinal axis with a plurality of curves, such as the fourth fluid movement structure 630-4 and fifth fluid movement structure 630-5 illustrated in FIG. 6. In some embodiments, a second state has a twisted longitudinal axis, such as the sixth fluid movement structure 630-6 illustrated in FIG. 6. In some embodiments, a fluid movement structure has any shape in any number of states, such as a curved first state, a twisted second state, and a looped third state. In at least one embodiment, the fluid movement structure twists around a longitudinal axis when changing states without a substantial change to a position, orientation, or dimension of the longitudinal axis or to external dimensions of the fluid movement structure. In such embodiments, the movement of the surface of the fluid movement structure ejects vapor bubbles therefrom without substantially altering a position, orientation, or dimension of the fluid movement structure relative to the surface of the body of the thermal management device or to the working fluid in which the fluid movement structure is immersed.

Figure 7:
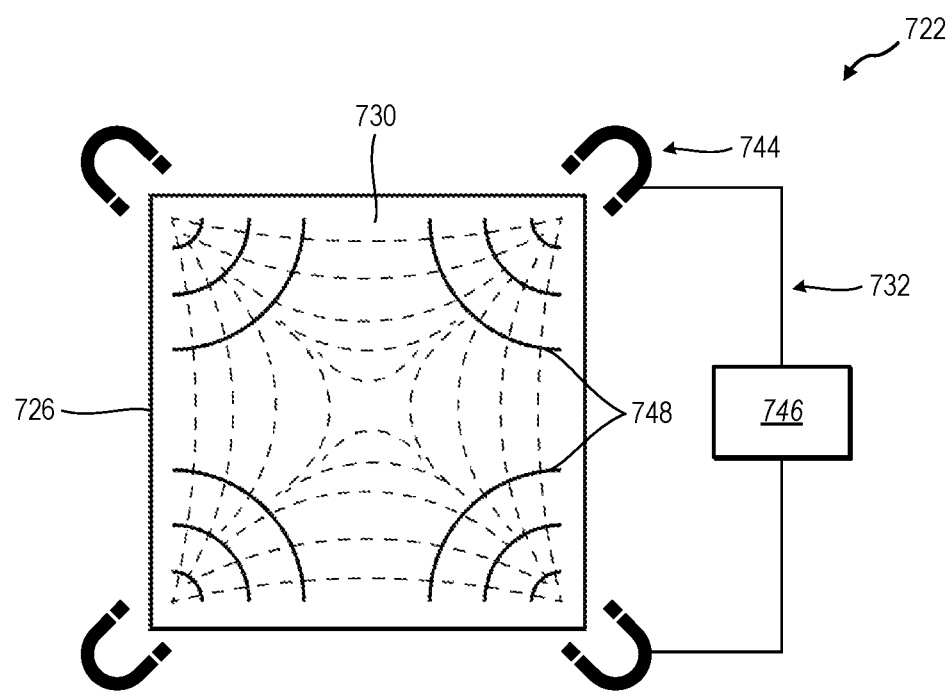
FIG. 7 is a top view of a thermal management device with an array of fluid movement structures activated by an activation device, according to at least one embodiment of the present disclosure.

Some embodiments of thermal management devices, according to the present disclosure, are passively activated, such as by a change in temperature. Some embodiments are actively activated by an activation device or mechanism other than the fluid movement structures themselves. Referring now to FIG. 7, a top view of an embodiment of a thermal management device 722 is shown with an activation device 732 including a plurality of electromagnets 744 positioned proximate an array of fluid movement structures 730. The fluid movement structures 730 are positioned on a surface of the body 726 of the thermal management device 722 and experience a magnetic force in response to the magnetic fields 748 generated by the electromagnets 744. In some embodiments, the thermal management device 722 includes an activation device 732 that includes an electromagnet 744 and a controller 746 in electrical and/or data communication with the electromagnet 744. The controller 746 communicates with the electromagnet 744 to selectively enable, disable, strengthen, or weaken the magnetic field 748 produced by the electromagnet 744. In the embodiment illustrated in FIG. 7, the electromagnets 744 of the activation device 732 can selectively activate the fluid movement structures 730 in different directions and/or at different magnitudes based at least partially on the magnitudes and directions of the magnetic field(s) 748 produced.

Figures 1, 8:
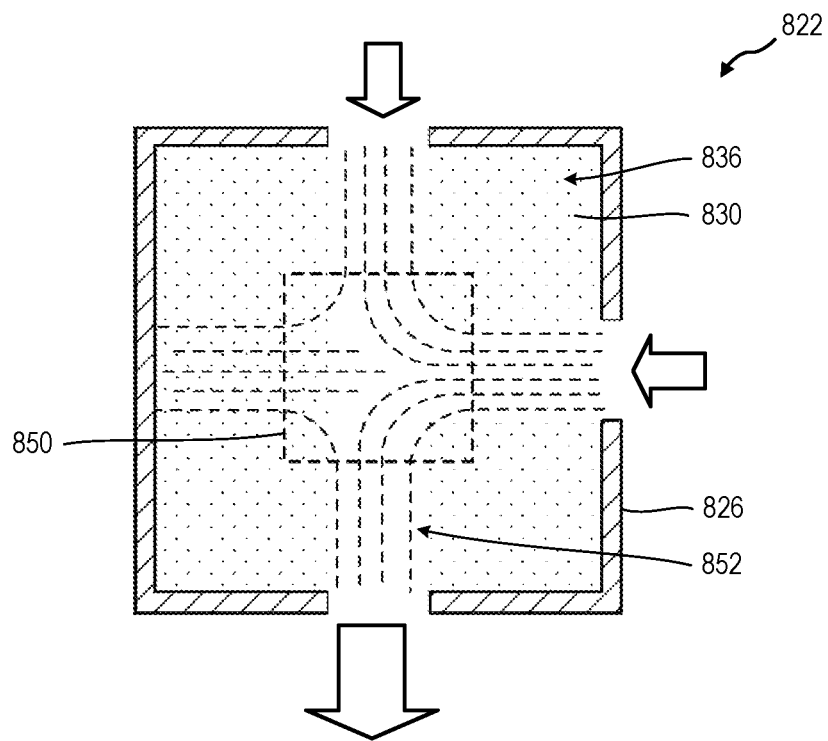
Figures 2, 8:
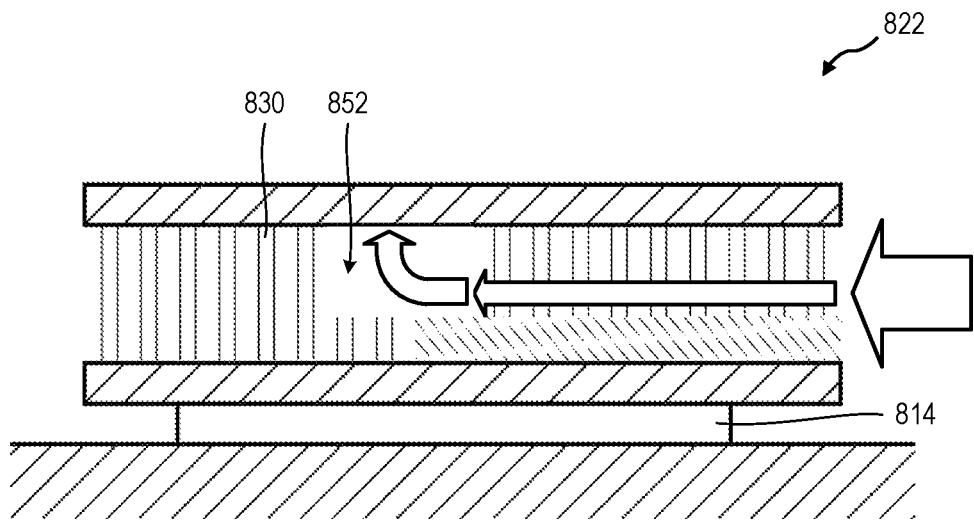

FIG. 8-1 is a top cross-sectional view of an internal volume of another embodiment of a thermal management device. As described herein, the fluid movement structures 830 are, in some embodiments, positioned in an internal volume 836 of a thermal management device 822. In some embodiments, fluid movement structures 830 that are oriented vertically (or normal to the surface of the body 826 from which they protrude) extend further into the working fluid and resist flow of the working fluid therethrough. As shown in the side view of FIG. 8-2 of the thermal management device 822 of FIG. 8-1, fluid movement structures 830 activated to bend or move laterally to have a lesser height than the vertical fluid movement structures 830 and create a channel 852 through the array of fluid movement structures 830 that directs flow of working fluid to selected regions of the thermal management device 822. The relatively higher flow allows greater cooling to those regions, allowing the working fluid to cool those regions more. In at least one embodiment, the fluid movement structures 830 transition to the second state (and move laterally) in response to a temperature change of the heat-generating component 814. As the center region 850 of the heat-generating component heats, a thermally-coupled center region 850 of the thermal management device 822 heats, and portions of the fluid movement structures move to create channels that direct flow of the working fluid across the center region.

Figures 1, 9:
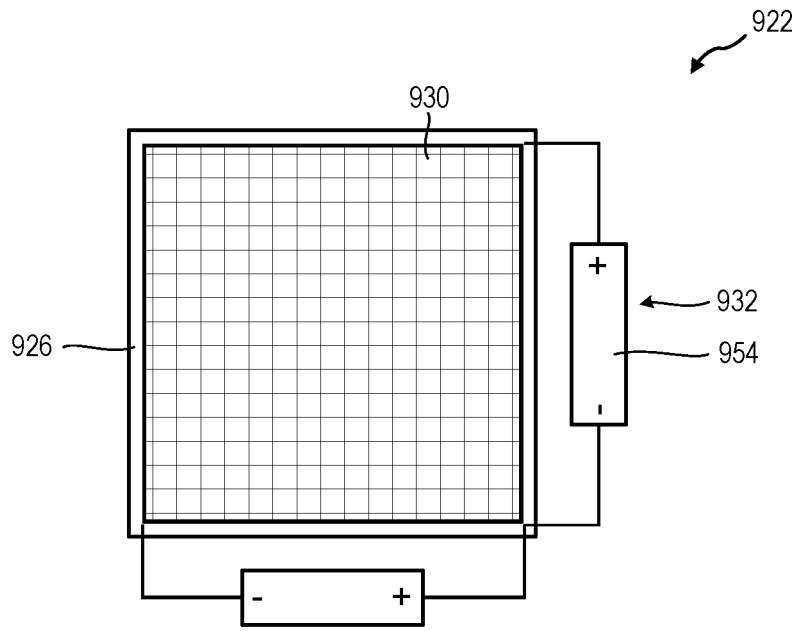
Figures 2, 9:
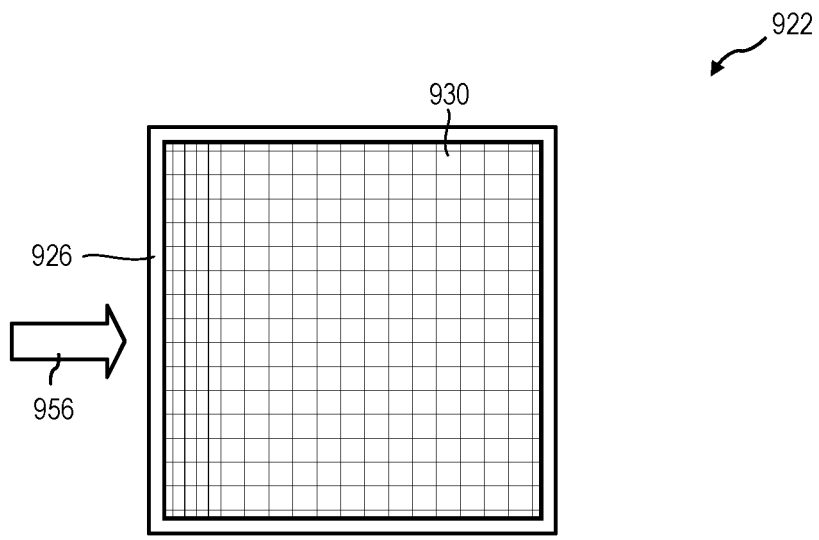
Figures 3, 9:
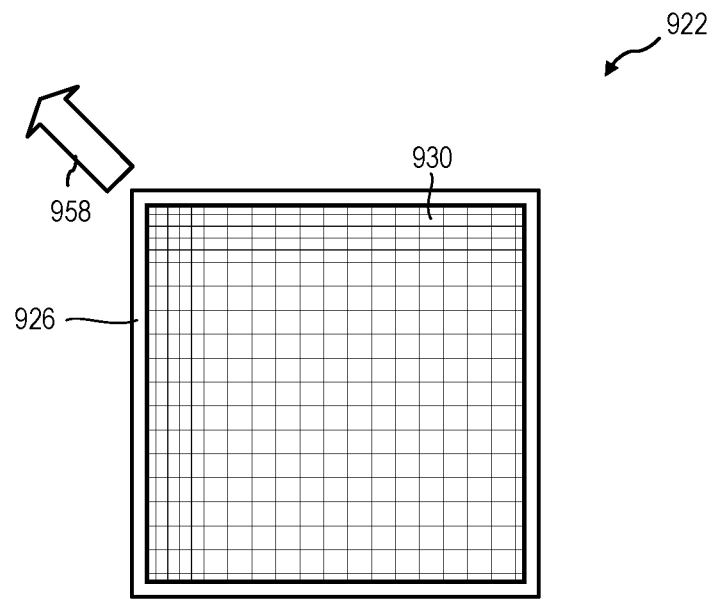

While embodiments of thermal management devices including an array of fluid movement structures have been described, in some embodiments, a thermal management device includes a fluid movement structure or elements that form a grid or mesh that is activated as a single element. FIG. 9-1 is a top view of a piezoelectric fluid movement structure 930 that is a grid positioned on a surface of the body 926 of the thermal management device 922. The fluid movement structure 930 is, for example, fixed to the surface of the body 926 of the thermal management device 922 at the corners of the grid, and an activation device 932 including an electrical source 954 is connected to the fluid movement structure 930. The electrical source(s) 954 is configured to apply an electric potential to the grid.

FIG. 9-2 illustrates the thermal management device 922 of FIG. 9-1 with an electric potential applied thereto in a first direction. In response to the electric potential, the piezoelectric material of the fluid movement structure 930 changes dimension in at least direction and the spacing of the grid changes. The result is a net movement of the grid in a lateral direction 956 relative to the body 926 of the thermal management device 922. FIG. 9-3 illustrates the thermal management device 922 of FIG. 9-1 with an electric potential applied to the fluid movement structure 930 in the first direction and a second direction. The result is a net movement in a diagonal direction 958 relative to the body 926 of the thermal management device 922.

Figure 10:
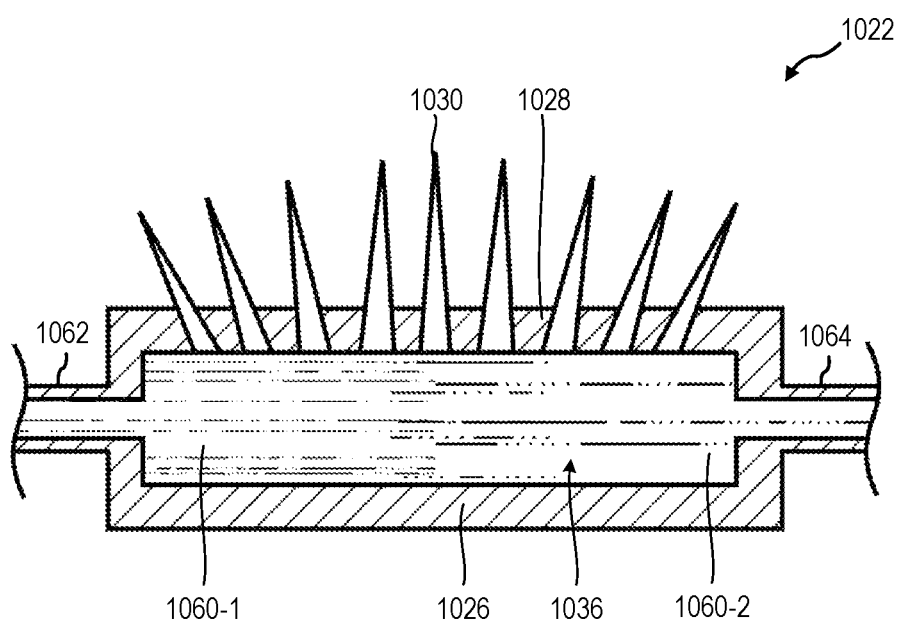
FIG. 10 is a side cross-sectional view of a thermal management device with chemically-activated fluid movement structures, according to at least one embodiment of the present disclosure.

In some embodiments, a thermal management device includes chemically activated fluid movement structures that change shape and/or move in response to contact with a chemical agent. In some embodiments, the chemical agent is present in the working fluid in which the fluid movement structures are immersed. In other embodiments, it is desirable to keep the working fluid and the chemical agent separate. FIG. 10 is a cross-sectional side view of an embodiment of a thermal management device 1022 with fluid movement structures 1030 protruding from an external surface 1028 of the body 1026 and a chemical agent 1060 located in an internal volume 1036. In some embodiments, an inlet 1062 and outlet 1064 of the internal volume 1036 allows different fluids and/or chemical agents to flow through the internal volume 1036. For example, a first chemical agent 1060-1 is present in the internal volume 1036, which activates at least some of the fluid movement structures 1040 to move in a first lateral direction. A second chemical agent 1060-2 is introduced to the internal volume 1036 through the inlet 1062, which urges the first chemical agent 1060-2 through the internal volume 1036 and out the outlet 1064 of the internal volume 1036. As the second chemical agent 1060-2 contacts the ends of the fluid movement structures 1030, the second chemical agent 1060-2 activates at least some of the fluid movement structures 1030 to move in a second lateral direction. The fluid movement structures 1030, thereby, can eject vapor bubbles from the fluid movement structures 1030 and/or external surface 1028 of the body 1026 of the thermal management device 1022, can direct flow of working fluid across the external surface 1028 of the thermal management device 1022, or pump or urge the working fluid relative to the thermal management device 1022.

Some embodiments of thermal management devices, according to the present disclosure, include a fluid movement structure located on a surface of the body of the thermal management device with a means for moving the fluid movement structure relative to the surface. In some embodiments, the means for moving the fluid movement structure(s) includes a thermal means.

In some embodiments, the means for moving the fluid movement structure(s) includes an electrical means. For example, an electrical means includes any of the piezoelectric materials, piezoelectric structures, electrical activation devices, electrical potential sources, electrical current sources, or other electrical movement mechanisms described herein, or combinations thereof. In at least one example, an electrical means for moving includes an electrical source configured to apply an electrical potential to a fluid movement structure including a piezoelectric material.

In some embodiments, the means for moving the fluid movement structure(s) includes a magnetic means. For example, a magnetic means includes any ferromagnetic, diamagnetic, or electromagnetic materials, structures, or activation devices described herein or combinations thereof. In at least one example, a magnetic means for moving includes an electromagnet positioned proximate a fluid movement structure that, when producing a magnetic field, applies a magnetic force to the fluid movement structure to move the fluid movement structure.

In some embodiments, the means for moving the fluid movement structure(s) includes a chemical means. For example, a chemical means includes any chemical agent or chemically reactive material, structure, or activation device that described herein, or combinations thereof. In at least one example, a chemical means includes an ionic chemical agent that, when introduced to and/or contacting the fluid movement structure, alters a charge of the fluid movement structure material, resulting in a change in shape of the fluid movement structure.

Figure 11:
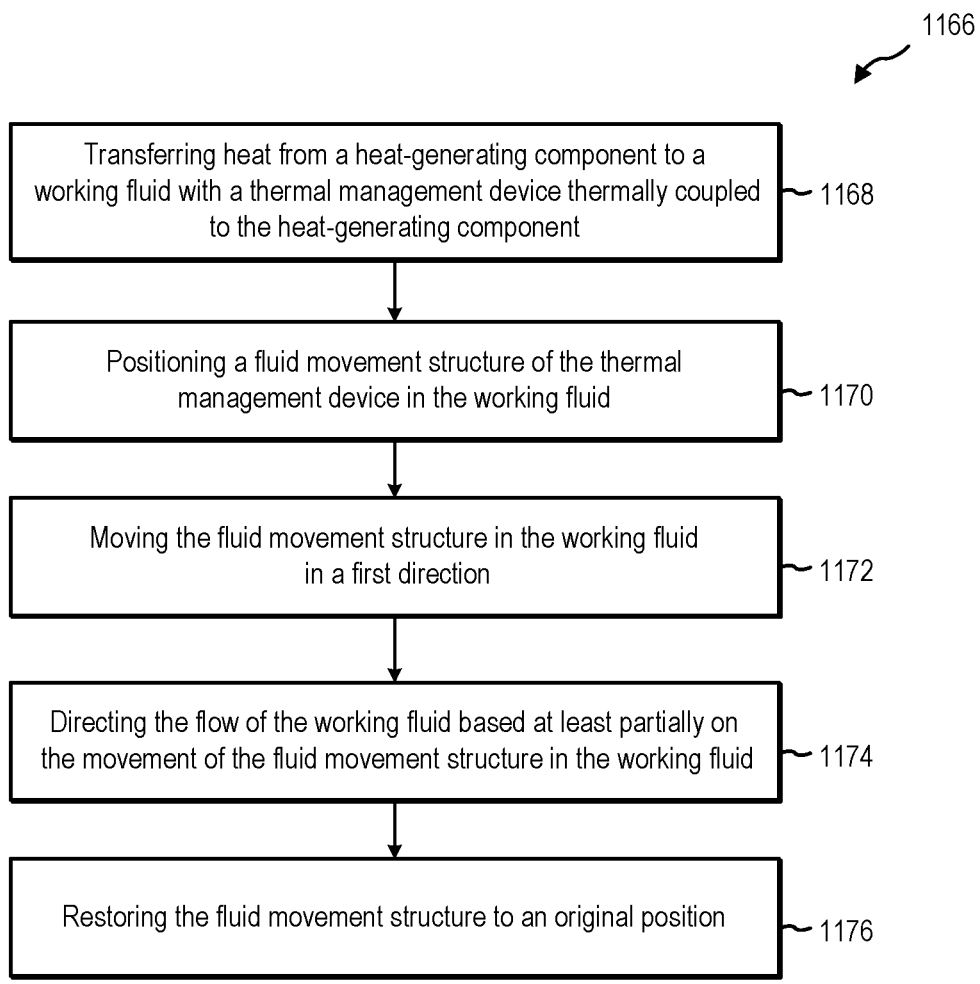
FIG. 11 is a flowchart illustrating a method of thermal management, according to at least one embodiment of the present disclosure.

FIG. 11 is a flowchart illustrating an embodiment of a method 1166 of thermal management as described herein. The method 1166 includes transferring heat from a heat-generating component to a working fluid with a thermal management device thermally coupled to the heat-generating component at 1168. As described herein, embodiments of thermal management devices, according to the present disclosure, are configured to receive heat from a heat-generating component and transfer the heat to a working fluid to exhaust heat from the heat-generating component. The method 1166 further includes positioning a fluid movement structure of the thermal management device in the working fluid at 1170. The fluid movement structure may be or include any fluid movement structure described herein or any combination of features thereof. The method 1166 includes moving the fluid movement structure in the working fluid in a first direction at 1172 and changing flow of the working fluid based at least partially on the movement of the fluid movement structure in the working fluid at 1174. As described herein, moving the fluid movement structure, in some embodiments, includes actively activating the fluid movement structure or passively activating the fluid movement structure. As described herein, moving the fluid movement structure, in some embodiments, includes activating the fluid movement structure with an activation device and/or controller. As described herein, moving the fluid movement structure, in some embodiments, includes a chemical means, an electrical means, a magnetic means, a thermal means, or other means of moving the fluid movement structure. As described herein, the movement of the fluid movement structure may eject a vapor bubble, thereby changing the flow of the working fluid; may pump liquid working fluid across a surface of the body of the thermal management device, thereby changing the flow of the working fluid; may create a channel through which the working fluid can flow with less fluidic drag or other resistance, thereby changing the flow of the working fluid; or other changes to the flow of the working fluid.

In some embodiments, the method 1166 further includes restoring the fluid movement structure to an original position of the fluid movement structure at 1176. In some embodiments, restoring the fluid movement structure to an original position includes allowing an elastic restoration force to restore the fluid movement structure. In some embodiments, restoring the fluid movement structure to an original position includes activating the fluid movement device in a second direction to move the fluid movement device in a second lateral direction. In some embodiments, moving the fluid movement device in a second lateral direction includes using a second activation device.

INDUSTRIAL APPLICABILITY

A thermal management device immersed in the working fluid transfers heat from the heat-generating components to the working fluid. The thermal transfer rate to the working fluid is based partially on a temperature difference between the thermal management device coupled to the heat-generating component and the working fluid. For example, a larger temperature difference creates a higher thermal transfer rate. The thermal transfer rate to the working fluid is based partially on the phase of the working fluid. For example, the thermal transfer rate to the liquid phase of the working fluid is higher than the thermal transfer rate to the vapor phase of the working fluid.

In some embodiments, a thermal management device, according to the present disclosure, includes at least one movable fluid movement structure positioned on a surface of a body of the thermal management device. A movement mechanism or means for moving the fluid movement structure is configured to move the fluid movement structure relative to the surface of the body of the thermal management device and/or relative to other fluid movement structures of the thermal management device.

In some embodiments, the movement mechanism is or includes a piezoelectric element, a shape memory element, a thermal expansion element, a magnetic element, a chemically reactive element, or combinations thereof. The movement mechanism is, in some embodiments, affixed to the fluid movement structure. For example, the fluid movement structure may be an elongated metal rod, and a piezoelectric element affixed to a lateral side of the elongated metal rod is configured to elastically deform the elongated metal rod in the lateral direction when an electric potential is applied thereto. In other embodiments, the movement mechanism is integrally formed with the fluid movement structure. For example, the fluid movement structure may be formed of a shape memory material which, when heated beyond a transition temperature, changes macro shape based on microstructural transitions.

The fluid movement structures of the thermal management device, in some embodiments, direct or urge working fluid relative to a surface of the body of the thermal management device to increase a thermal transfer rate between the thermal management device and the working fluid. In some embodiments, one or more fluid movement structures are movable relative to a surface of the body of the thermal management device using the movement mechanism to dislodge vapor bubbles from the surface of the body of the fluid movement structure(s) and/or thermal management device. In some embodiments, one or more fluid movement structures are movable relative to a surface of the body of the thermal management device using the movement mechanism to pump or urge the working fluid across the surface of the body of the thermal management device. The one or more fluid movement structures, thereby, expel hot working fluid and provide a supply of cooler working fluid to the thermal management device. In some embodiments, one or more fluid movement structures are movable relative to a surface of the body of the thermal management device using the movement mechanism to alter a topography of the thermal management device (e.g., create channels or passages) and direct working fluid toward higher temperature regions of the thermal management device, thereby increasing thermal efficiency of the thermal management device. For example, the heat-generating component may produce heat heterogeneously, and thermal management requirements of the thermal management device may change depending on the operational conditions of the heat-generating component.

In some embodiments, the one or more fluid movement structures are actively actuated. Active actuation allows the one or more fluid movement structures of the thermal management device to selectively move or otherwise respond based at least partially on conditions of the working fluid and/or heat-generating component. For example, a controller may be in communication with one or more sensors (temperature sensors, flow rate sensors, vapor sensors, etc.) and the controller may actuate the one or more fluid movement structures in response to measurements of the sensor(s). In some embodiments, the one or more fluid movement structures are passively actuated. Passive actuation may allow the one or more fluid movement structures to move or otherwise respond based at least partially on conditions of the working fluid and/or heat-generating component without external controls, sensors, or wires. For example, a fluid movement structure including or made of a shape memory material with a transition temperature at or above the boiling temperature of the working fluid will remain in a first state while immersed in the liquid phase of the working fluid. In such an example, when the fluid movement structure contacts a vapor phase of the working fluid, the vapor phase allows the fluid movement structure to rise in temperature, allowing the shape memory material to transition to a second state, resulting in a passive actuation of the fluid movement structure. The fluid movement structure is therefore in a first position (first microstructural state) when in contact with liquid phase working fluid and transitions to a second position (second microstructural state) when in contact with vapor phase working fluid.

In some embodiments, the movement mechanism includes a piezoelectric fluid movement structure. In some embodiments, a piezoelectric fluid movement structure is a fluid movement structure with a piezoelectric material coupled thereto and configured to apply a force to the fluid movement structure. In some embodiments, a piezoelectric fluid movement structure is a fluid movement structure made of or including a piezoelectric material integrally formed therewith. The fluid movement structure is configured to change shape in at least one dimension when an electric potential is applied to the piezoelectric material.

In some embodiments, the movement mechanism includes a shape memory fluid movement structure. In some embodiments, a shape memory fluid movement structure is a fluid movement structure with a shape memory material (shape memory alloy, shape memory polymer, etc.) coupled thereto and configured to apply a force to the fluid movement structure. In some embodiments, a shape memory fluid movement structure is a fluid movement structure made of or including a shape memory material integrally formed therewith. The fluid movement structure is configured to change shape in at least one dimension upon heating or cooling beyond a transition temperature.

In some embodiments, the movement mechanism includes a magnetic fluid movement structure. In some embodiments, a magnetic fluid movement structure is a fluid movement structure with a ferromagnetic material coupled thereto and configured to apply a force to the fluid movement structure. In some embodiments, a magnetic fluid movement structure is a fluid movement structure made of or including a ferromagnetic material integrally formed therewith. The fluid movement structure is configured to change shape in at least one dimension upon exposure to a magnetic field. In some embodiments, a magnetic fluid movement structure is a fluid movement structure with an electromagnet coupled thereto and configured to apply a force to the fluid movement structure. The electromagnetic generates a magnetic field and the fluid movement structure experiences an associated force based on the interaction of the magnetic field of the electromagnetic with another ferromagnetic material, such as a second fluid movement structure or an external ferromagnetic material positioned proximate the thermal management device.

In some embodiments, the movement mechanism includes a thermal expansion fluid movement structure. In some embodiments, a thermal expansion fluid movement structure is a fluid movement structure with a including a first material and a second material wherein the first material has a first coefficient of thermal expansion that is different from that of the second material. For example, the first material may be coupled to the second material of the fluid movement structure. Upon changes in temperature, the difference in thermal expansion between the first material and second material applies a force to move the fluid movement structure in at least one dimension. In some embodiments, a thermal expansion fluid movement structure is a fluid movement structure made of or including a combination of materials integrally formed such that, upon changes in temperature, the difference in thermal expansion between the first material and second material applies a force to move the fluid movement structure in at least one dimension. The fluid movement structure is configured to change shape in at least one dimension upon heating or cooling temperature.

In some embodiments, the movement mechanism includes a chemically reactive fluid movement structure. In some embodiments, a chemically reactive fluid movement structure is a fluid movement structure with a chemically reactive material coupled thereto and configured to apply a force to the fluid movement structure. In some embodiments, a chemically reactive fluid movement structure is a fluid movement structure made of or including a chemically reactive material integrally formed therewith. The chemically reactive fluid movement structure is configured to change shape in at least one dimension when the chemically reactive material is exposed to an activation chemical. In some embodiments, the activation chemical is introduced to the working fluid in which the chemically reactive fluid movement structure is immersed. In some embodiments, the thermal management device includes an internal volume into which the activation chemical is introduced to activate the chemically reactive fluid movement structure and move the chemically reactive fluid movement structure in the working fluid.

In at least one embodiment, the fluid movement structure includes a combination of movement mechanisms described herein. In at least one example, a fluid movement structure is movable in a first direction by a first movement mechanism and movable in a second direction by a second movement mechanism. In some embodiments, the first direction and second direction are opposite one another. In some embodiments, the first direction and second direction are orthogonal to one another. In some embodiments, the first direction and second direction are at a non-orthogonal angle to one another.

The fluid movement structures of the thermal management devices described herein have a variety of shapes or sizes. In some embodiments, the fluid movement structures are or include a pin, rod, leaf, fin, grid, mesh, pipe, cylinder, wire, or combinations thereof.

In some embodiments, at least some of the fluid movement structures are located on an external surface of the body of the thermal management device. For example, the thermal management device is coupled to a heat-generating component and the fluid movement structure(s) is located on an outside surface of the body opposite the heat-generating component. In such embodiments, the external fluid movement structures contact a working fluid that receives heat from the thermal management device and carries the heat away from the thermal management device to cool the heat-generating component. In some embodiments, the external fluid movement structures direct the movement of the working fluid relative the thermal management device, such as directing the flow toward hotter regions of the thermal management device. In some embodiments, the external fluid movement structures limit and/or prevent dryout of the thermal management device by ejecting vapor bubbles from the external fluid movement structures and/or a surface of the body of the thermal management device.

In some embodiments, at least some of the fluid movement structures are located on an internal surface of the body of the thermal management device, such as contacting a working fluid contained in a vapor chamber or other internal volume of the thermal management device. In such embodiments, the internal fluid movement structures contact a working fluid that receives heat from the thermal management device and carries the heat away from the thermal management device to cool the heat-generating component. In some embodiments, the internal fluid movement structures direct the movement of the working fluid through the internal volume of the thermal management device, such as directing the flow of hot working fluid to cooler regions of the thermal management device. In some embodiments, the internal fluid movement structures promote movement of the working fluid through the internal volume of the thermal management device by ejecting vapor bubbles from the internal fluid movement structures and/or the internal surface of the body of the thermal management device.

In some embodiments, the movement mechanism includes an activation device that activates and/or moves the fluid movement structures. The activation device is external to the fluid movement structures of the thermal management device and applies or provides a signal, energy, field, reagent, or other activation mechanism to the fluid movement structure to move the fluid movement structure. In some embodiments, the activation device includes an electrical source configured to apply an electric potential (e.g., to the fluid movement structure). For example, the electrical potential may be delivered through a conductive element to a piezoelectric fluid movement structure to activate the piezoelectric element. In some examples, the electrical potential is delivered via an electric field to a piezoelectric fluid movement structure to activate the piezoelectric element.

In some embodiments, the activation device includes a magnetic field source that applies a magnetic field to the fluid movement structure to move the fluid movement structure. For example, an electromagnetic activation device may apply a magnetic field in a variety of directions to apply an associated magnetic force to the fluid movement structure to move the fluid movement structure in a selected direction.

In some embodiments, an activation device includes a chemical activation device that selectively provides a chemical agent to the fluid movement structure to activate and move the fluid movement structure. In at least one example, the chemical activation device introduces the chemical agent to the working fluid in which the thermal management device is immersed. In at least another example, the chemical activation device introduces the chemical agent to an internal volume of the thermal management device, and the chemical agent contacts a portion of the fluid movement structure proximate the internal volume.

Thermal management devices, according to the present disclosure, may be used in an immersion cooling system to increase the efficiency of the immersion cooling system. Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system includes an immersion tank containing an immersion chamber and a condenser in the immersion chamber. The immersion chamber contains an immersion working fluid that has a liquid working fluid and a vapor working fluid portion. The liquid working fluid creates an immersion bath in which a plurality of heat-generating components is positioned to heat the liquid working fluid on supports.

In some embodiments, an immersion cooling system includes an immersion tank defining an immersion chamber with an immersion working fluid positioned therein. An immersion working fluid in the immersion tank has a boiling temperature that is at least partially related to one or more operating properties of the immersion cooling system, the electronic components and/or computing devices in the immersion tank, computational or workloads of the electronic components and/or computing devices in the immersion tank, external and/or environmental conditions, or other properties that affect the operation of the immersion cooling system.

In some embodiments, the immersion working fluid transitions between a liquid working fluid phase and a vapor working fluid phase to remove heat from hot or heat-generating components in the immersion chamber. The liquid working fluid more efficiency receives heat from the heat-generating components and, upon transition to the vapor working fluid, the vapor working fluid can be removed from the immersion tank, cooled and condensed by the condenser (or other heat exchanger) to extract the heat from the working fluid, and the liquid working fluid can be returned to the liquid immersion bath.

In some embodiments, the immersion bath of the liquid working fluid has a plurality of heat-generating components positioned in the liquid working fluid. The liquid working fluid surrounds at least a portion of the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the liquid working fluid may remove heat through convective cooling.

In some embodiments, the heat-generating components include electronic or computing components or power supplies. In some embodiments, the heat-generating components include computer devices, such as individual personal computer or server blade computers. In some embodiments, one or more of the heat-generating components includes a thermal management device or other device attached to the heat-generating component to conduct away thermal energy and effectively increase the surface area of the heat-generating component. In some embodiments, the thermal management device of the heat-generating component is a vapor chamber with one or more three-dimensional structures to increase surface area.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor working fluid rises in the liquid working fluid, the vapor working fluid can be extracted from the immersion chamber in an upper vapor region of the chamber. A condenser cools part of the vapor working fluid back into a liquid working fluid, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system for thermal management of computing devices allows at least one immersion tank and/or chamber to be connected to and in fluid communication with an external condenser. In some embodiments, an immersion cooling system includes a vapor return line that connects the immersion tank to the condenser and allows vapor working fluid to enter the condenser from the immersion tank and/or chamber and a liquid return line that connects the immersion tank to the condenser and allows liquid working fluid to return to the immersion tank and/or chamber.

The vapor return line may be colder than the boiling temperature of the working fluid. In some embodiments, a portion of the vapor working fluid condenses in the vapor return line. The vapor return line can, in some embodiments, be oriented at an angle such that the vapor return line is non-perpendicular to the direction of gravity. The condensed working fluid can then drain either back to the immersion tank or forward to the condenser depending on the direction of the vapor return line slope. In some embodiments, the vapor return line includes a liquid collection line or valve, like a bleeder valve, that allows the collection and/or return of the condensed working fluid to the immersion tank or condenser.

In some examples, an immersion cooling system includes an air-cooled condenser. An air-cooled condenser may require fans or pumps to force ambient air over one or more heat pipes or fins to conduct heat from the condenser to the air.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

In some embodiments, a thermal management device is directly coupled to a heat-generating component. For example, the thermal management device may be directly contacting the heat-generating component on a proximal surface of the body. In some embodiments, the thermal management device is indirectly thermally coupled to the heat-generating component. For example, the thermal management device may be thermally coupled to the heat-generating electronic component by a thermal interface material, such as thermal paste, positioned between a proximal surface of the body of the thermal management device and the heat-generating electronic component. In some examples, the thermal management device may be thermally coupled to the heat-generating electronic component by a liquid phase metal positioned between a proximal surface of the body of the thermal management device and the heat-generating electronic component. In some examples, the thermal management device may be thermally coupled to the heat-generating electronic component by a heat spreader positioned between a proximal surface of the body of the thermal management device and the heat-generating electronic component. In some embodiments, the thermal management device is thermally coupled to the heat-generating electronic component by a heat sink positioned between and contacting a proximal surface of the body of the thermal management device and the heat-generating electronic component. In some embodiments, the thermal management device is thermally coupled to the heat-generating electronic component by a heat pipe positioned between and contacting a proximal surface of the body of the thermal management device and the heat-generating electronic component. In some embodiments, the thermal management device is thermally coupled to the heat-generating electronic component by a vapor chamber positioned between and contacting a proximal surface of the body of the thermal management device and the heat-generating electronic component.

A plurality of fluid movement structures is positioned on an outer surface of the body of the thermal management device opposite the heat-generating component. In some embodiments, the fluid movement structures are immersed in a working fluid. As the heat-generating component produces heat during operation, the heat is transferred to the thermal management device and from the thermal management device to the working fluid. In some embodiments, the working fluid is a two-phase working fluid, and the liquid phase vaporizes into vapor bubbles of a vapor phase of the working fluid upon receiving a sufficient quantity of heat from the thermal management device. In some embodiments the vapor bubbles adhere to the outer surface of the body of the thermal management device and/or to the fluid movement structures of the thermal management device. The vapor bubbles contacting the thermal management device reduce the thermal transfer rate from the thermal management device to the working fluid. A reduction in thermal transfer rate from the thermal management device to the working fluid, in some embodiments, reduces a thermal transfer rate from the heat-generating component to the thermal management device and adversely affects the heat-generating component.

The movement mechanism, in some embodiments, moves the fluid movement structures in a convergent lateral direction relative to a longitudinal direction of the fluid movement structures to dislodge, shake, or otherwise eject the vapor bubbles from the outer surface of the body and fluid movement structures of the thermal management device. The convergent lateral direction is a lateral direction of each fluid movement structure that is toward a center of the thermal management device. For example, a magnetic activation device including a loop of conductive material positioned around the thermal management device may generate a convergent magnetic field to urge magnetic fluid movement structures in a convergent lateral direction. The direction of a current in the loop of conductive material may be changed to reverse the direction of the magnetic field and urge the fluid movement structures in a different direction to dislodge, shake, or otherwise eject the vapor bubbles from the outer surface of the body and fluid movement structures of the thermal management device.

In some embodiments, the movement mechanism moves each of the fluid movement structures in the same lateral direction. For example, a magnetic activation device with a first electromagnet a first lateral side of the thermal management device and a second electromagnet on a second lateral side of the thermal management device opposite the first side may generate a substantially linear magnetic field that urges the fluid movement structures in a uniform lateral direction to dislodge, shake, or otherwise eject the vapor bubbles from the outer surface of the body and fluid movement structures of the thermal management device.

In some embodiments, activation device or movement mechanism of the thermal management device is configured to move different fluid movement structures at different times relative to one another. For example, a first electromagnet may apply a first magnetic field to a first portion of the array of fluid movement structures, and a second electromagnet may apply a second magnetic field to a second portion of the array of fluid movement structures at a different time. In other examples, a chemical agent activates fluid movement structures in sequence as the chemical agent flows across a surface of the thermal management device, and the fluid movement structures activate at different times in response to the movement of the chemical agent. In some embodiments, the movement mechanism moves the fluid movement structures in a wave-like pattern to urge the working fluid in the direction of the wave.

In some embodiments a thermal management device has fluid movement structures located on an internal surface of the body of the thermal management device. The thermal management device includes an internal volume containing a working fluid that flows within the internal volume to distribute heat through the thermal management device. In some embodiments, the fluid movement structures are configured to move relative to the internal surface of the body to move the working fluid in the internal volume. For example, at least some of the fluid movement structures are configured to move in a lateral direction relative to a normal direction of the internal surface of the body from which the fluid movement structures protrude. In some embodiments, the lateral movement of the fluid movement structures sweeps or pumps working fluid within the internal volume based on active or passive activation to move heat in the thermal management device. In some embodiments, a thermal management device includes the internal fluid movement structures described herein and the external fluid movement structures described herein.

In some embodiments, at least one fluid movement structure of a thermal management device is configured to move or change dimension in longitudinal direction of the fluid movement structure. The fluid movement structures, in some embodiments, are configured to change dimension in a longitudinal direction. Extending or shortening in longitudinal length can allow the fluid movement structures to change a surface area to volume ratio of the fluid movement structure, allow the fluid movement structure to extend into or retract from the flow of working fluid, eject vapor bubbles from the fluid movement structure and/or surface of the body of the thermal management device, or combinations thereof. The thermal efficiency and/or thermal transfer rate between the thermal management device and the working fluid in which the thermal management device is immersed is therefore altered by longitudinal changes of the fluid movement structures.

While examples of fluid movement structures have been described herein that move or change dimension in a lateral direction and/or a longitudinal direction, it should be understood that fluid movement structures may change between any positions, dimensions, or shapes to change thermal properties and/or eject vapor bubbles according to the present disclosure. In some embodiments, a fluid movement structure curves, twists, loops, or otherwise changes a direction of a longitudinal axis of the fluid movement structure. In some embodiments, at least one fluid movement structure has a first state with a first longitudinal axis and a second state with a different longitudinal axis wherein the fluid movement structure changes from the first state to the second state when activated by a movement mechanism. In at least one example, a plurality of fluid movement structures includes shape memory materials that, when activated, cause the longitudinal axis of the fluid movement structure to curve, twist, loop, or otherwise change direction.

In some embodiments, a first state has a substantially straight longitudinal axis. In some embodiments, a second state has a curved longitudinal axis. In some embodiments, a second state has a looped longitudinal axis (e.g., curved to overlap another portion of the fluid movement structure). In some embodiments, a second state has a curved longitudinal axis with a plurality of curves. In some embodiments. In some embodiments, a fluid movement structure has any shape in any number of states, such as a curved first state, a twisted second state, and a looped third state. In at least one embodiment, the fluid movement structure twists around a longitudinal axis when changing states without a substantial change to a position, orientation, or dimension of the longitudinal axis or to external dimensions of the fluid movement structure. In such embodiments, the movement of the surface of the fluid movement structure ejects vapor bubbles therefrom without substantially altering a position, orientation, or dimension of the fluid movement structure relative to the surface of the body of the thermal management device or to the working fluid in which the fluid movement structure is immersed.

Some embodiments of thermal management devices, according to the present disclosure, are passively activated, such as by a change in temperature. Some embodiments are actively activated by an activation device or mechanism other than the fluid movement structures themselves. In some embodiments, the fluid movement structures are positioned on a surface of the body of the thermal management device and experience a magnetic force in response to the magnetic fields generated by the electromagnets. In some embodiments, the thermal management device includes an activation device that includes an electromagnet and a controller in electrical and/or data communication with the electromagnet. The controller communicates with the electromagnet to selectively enable, disable, strengthen, or weaken the magnetic field produced by the electromagnet. In some embodiments, the electromagnets of the activation device can selectively activate the fluid movement structures in different directions and/or at different magnitudes based at least partially on the magnitudes and directions of the magnetic field(s) produced.

As described herein, the fluid movement structures are, in some embodiments, positioned in an internal volume of a thermal management device. In some embodiments, fluid movement structures that are oriented vertically (or normal to the surface of the body from which they protrude) extend further into the working fluid and resist flow of the working fluid therethrough. In some embodiments, fluid movement structures activated to bend or move laterally to have a lesser height than the vertical fluid movement structures and create a path through the array of fluid movement structures that directs flow of working fluid to selected regions of the thermal management device. The relatively higher flow allows greater cooling to those regions, allowing the working fluid to cool those regions more. In at least one embodiment, the fluid movement structures transition to the second state (and move laterally) in response to a temperature change of the heat-generating component. As the center region of the heat-generating component heats, a thermally-coupled center region of the thermal management device heats, and portions of the fluid movement structures move to create channels that direct flow of the working fluid across the center region.

While embodiments of thermal management devices including an array of fluid movement structures have been described, in some embodiments, a thermal management device includes a fluid movement structure or elements that form a grid or mesh that is activated as a single element. In some embodiments, a piezoelectric fluid movement structure is a grid positioned on a surface of the body of the thermal management device. The fluid movement structure is, for example, fixed to the surface of the body of the thermal management device at the corners of the grid, and an electrical source is connected to the fluid movement structure. The electrical source(s) are configured to apply an electric potential to the grid.

In response to the electric potential, the piezoelectric material of the grid changes dimension in at least direction and the spacing of the grid changes. The result is a net movement of the grid in a lateral direction. In some embodiments, an electric potential is applied thereto in the first direction and a second direction. The result is a net movement in a diagonal direction from the surface of the body of the thermal management device.

In some embodiments, a thermal management device includes chemically activated fluid movement structures that change shape and/or move in response to contact with a chemical agent. In some embodiments, the chemical agent is present in the working fluid in which the fluid movement structures are immersed. In other embodiments, it is desirable to keep the working fluid and the chemical agent separate. In some embodiments, a thermal management device has fluid movement structures positioned on an external surface of the body and a chemical agent located in an internal volume. In some embodiments, an inlet and outlet of the internal volume allows different fluids and/or chemical agents to flow through the internal volume. For example, a first chemical agent is present in the internal volume, which activates at least some of the fluid movement structures to move in a first lateral direction. A second chemical agent is introduced to the internal volume through the inlet, which urges the first chemical agent through the internal volume and out the outlet of the internal volume. As the second chemical agent contacts the ends of the fluid movement structures, the second chemical agent activates at least some of the fluid movement structures to move in a second lateral direction. The fluid movement structures, thereby, can eject vapor bubbles from the fluid movement structures and/or surface of the body of the thermal management device, can direct flow of working fluid, or pump or urge the working fluid relative to the thermal management device.

Some embodiments of thermal management devices, according to the present disclosure, include a fluid movement structure located on a surface of the body of the thermal management device with a means for moving the fluid movement structure relative to the surface. In some embodiments, the means for moving the fluid movement structure(s) includes a thermal means.

In some embodiments, the means for moving the fluid movement structure(s) includes an electrical means. For example, an electrical means includes any of the piezoelectric materials, piezoelectric structures, electrical activation devices, electrical potential sources, electrical current sources, or other electrical movement mechanisms described herein, or combinations thereof. In at least one example, an electrical means for moving includes an electrical source configured to apply an electrical potential to a fluid movement structure including a piezoelectric material.

In some embodiments, the means for moving the fluid movement structure(s) includes a magnetic means. For example, a magnetic means includes any ferromagnetic, diamagnetic, or electromagnetic materials, structures, or activation devices described herein or combinations thereof. In at least one example, a magnetic means for moving includes an electromagnet positioned proximate a fluid movement structure that, when producing a magnetic field, applies a magnetic force to the fluid movement structure to move the fluid movement structure.

In some embodiments, the means for moving the fluid movement structure(s) includes a chemical means. For example, a chemical means includes any chemical agent or chemically reactive material, structure, or activation device that described herein, or combinations thereof. In at least one example, a chemical means includes an ionic chemical agent that, when introduced to and/or contacting the fluid movement structure, alters a charge of the fluid movement structure material, resulting in a change in shape of the fluid movement structure.

The present disclosure relates to systems and methods for cooling electronic components and/or devices according to at least the examples provided in the sections below:

[A1] In some embodiments, a thermal management device includes a body, a fluid movement structure, and a movement mechanism. The body is configured to receive heat from a heat-generating component at a proximal surface, and the fluid movement structure is on a distal surface of the body that is distal to the proximal surface, wherein the fluid movement structure is configured to direct fluid flow of a working fluid and the body is configured to transfer heat to the working fluid. The movement mechanism is configured to move the fluid movement structure relative to the body.

[A2] In some embodiments, the movement mechanism of [A1] includes a piezoelectric material of the fluid movement structure.

[A3] In some embodiments, the movement mechanism of [A1] or [A2] includes a shape memory material of the fluid movement structure.

[A4] In some embodiments, the fluid movement structure any of [A1] through [A3] includes a rod.

[A5] In some embodiments, the fluid movement structure any of [A1] through [A3] includes a fin.

[A6] In some embodiments, the fluid movement structure any of [A1] through [A3] includes a mesh.

[A7] In some embodiments, the fluid movement structure any of [A1] through [A6] includes an array of elements configured to move relative to the body.

[A8] In some embodiments, the movement mechanism of [A7] is configured to move different elements of the fluid movement structure by different amounts relative to the body.

[A9] In some embodiments, the movement mechanism of [A7] is configured to move different elements of the fluid movement structure at different times relative to the body.

[A10] In some embodiments, the fluid movement structure of any of [A1] through [A9] has a longitudinal axis, and the movement mechanism is configured to change a longitudinal length of the fluid movement structure.

[A11] In some embodiments, the working fluid of any of [A1] through [A10] is a two-phase working fluid.

[B1] In some embodiments, a thermal management device includes a body, a fluid movement structure, and a means for moving the fluid movement structure. The body is configured to receive heat from a heat-generating component. The fluid movement structure is positioned on a surface of the body, and the means for moving the fluid movement structure moves the fluid movement structure relative to the surface of the body.

[B2] In some embodiments, the body of [B1] is a fluid heat spreader and the fluid movement structure is positioned in an internal volume of the heat spreader.

[B3] In some embodiments, the means for moving the fluid movement structure of [B1] or [B2] includes a chemical means.

[B4] In some embodiments, the means for moving the fluid movement structure of [B1] or [B2] includes a magnetic means.

[B5] In some embodiments, the means for moving the fluid movement structure of [B1] or [B2] includes an electrical means.

[B6] In some embodiments, the fluid movement structure of any of [B1] through [B5] has a longitudinal axis, and the means for moving is configured to move the fluid movement structure in a lateral direction to the longitudinal axis.

[C1] In some embodiments, a method of thermal management includes transferring heat from a heat-generating component to a working fluid with a thermal management device thermally coupled to the heat-generating component, positioning a fluid movement structure of the thermal management device in the working fluid, moving the fluid movement structure in the working fluid in a first direction, directing flow of the working fluid based at least partially on the movement of the fluid movement structure in the working fluid, and restoring the fluid movement structure to an original position.

[C2] In some embodiments, moving the fluid movement structure of [C1] includes activating the fluid movement structure in the first direction with an activation device, and the method further includes restoring the fluid movement structure by activating the fluid movement structure in a second direction with the activation device.

[C3] In some embodiments, directing flow of the working fluid of [C1] or [C2] includes creating a channel through an array of fluid movement structures of the thermal management device.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management device comprising:
    a working fluid;
    a body configured to receive heat from a heat-generating component at a proximal surface;
    a fluid movement structure affixed to a distal surface of the body that is distal to the proximal surface, wherein the fluid movement structure is immersed in the working fluid and configured to direct fluid flow of the working fluid across the distal surface, and wherein the body is configured to transfer heat to the working fluid; and
    a movement mechanism configured to move the fluid movement structure relative to the body.

2. The thermal management device of claim 1, wherein the movement mechanism includes a piezoelectric material of the fluid movement structure.

3. The thermal management device of claim 1, wherein the movement mechanism includes a shape memory material of the fluid movement structure.

4. The thermal management device of claim 1, wherein the fluid movement structure includes a rod.

5. The thermal management device of claim 1, wherein the fluid movement structure includes a fin.

6. The thermal management device of claim 1, wherein the fluid movement structure includes a mesh.

7. The thermal management device of claim 1, wherein the fluid movement structure includes an array of elements configured to move relative to the body.

8. The thermal management device of claim 7, wherein the movement mechanism is configured to move different elements of the fluid movement structure by different amounts relative to the body.

9. The thermal management device of claim 7, wherein the movement mechanism is configured to move different elements of the fluid movement structure at different times relative to the body.

10. The thermal management device of claim 1, wherein the fluid movement structure has a longitudinal axis, and the movement mechanism is configured to change a longitudinal length of the fluid movement structure.

11. The thermal management device of claim 1, wherein the working fluid is a two-phase working fluid.

12. A thermal management device comprising:
    a working fluid;
    a body configured to receive heat from a heat-generating component;
    a fluid movement structure positioned on a surface of the body and immersed in the working fluid; and a means for moving the fluid movement structure relative to the surface of the body.

13. The thermal management device of claim 12, wherein the body is a fluid heat spreader and the fluid movement structure is positioned in an internal volume of the heat spreader.

14. The thermal management device of claim 12, wherein the means for moving the fluid movement structure includes a chemical means.

15. The thermal management device of claim 12, wherein the means for moving the fluid movement structure includes a magnetic means.

16. The thermal management device of claim 12, wherein the means for moving the fluid movement structure includes an electrical means.

17. The thermal management device of claim 12, wherein the fluid movement structure has a longitudinal axis, and the means for moving is configured to move the fluid movement structure in a lateral direction to the longitudinal axis.

\* \* \* \* \*